United States Patent
Rönning et al.

(10) Patent No.: US 8,810,105 B2
(45) Date of Patent: Aug. 19, 2014

(54) APPARATUS AND METHOD FOR REDUCING ENERGY CONSUMPTION IN MONITORING MEANS OF A PLURALITY OF PIEZOELECTRIC COMPONENTS

(75) Inventors: Kasper Rönning, Espoo (FI); Sakari Tanhua, Espoo (FI); Pauli Laitinen, Helsinki (FI); Harry Van Dalen, Alkmaar (NL)

(73) Assignee: Aito B.V. (NL)

( * ) Notice: Subject to any disclaimer, the term of this patent is extended or adjusted under 35 U.S.C. 154(b) by 62 days.

(21) Appl. No.: 13/703,693

(22) PCT Filed: Jun. 8, 2011

(86) PCT No.: PCT/IB2011/052502
§ 371 (c)(1),
(2), (4) Date: Dec. 12, 2012

(87) PCT Pub. No.: WO2011/158155
PCT Pub. Date: Dec. 22, 2011

(65) Prior Publication Data
US 2013/0082568 A1   Apr. 4, 2013

Related U.S. Application Data

(60) Provisional application No. 61/354,718, filed on Jun. 15, 2010.

(51) Int. Cl.
*H01L 41/113* (2006.01)
(52) U.S. Cl.
USPC ............................................... 310/318
(58) Field of Classification Search
CPC .. H01L 41/113; H01L 41/1132; H01L 41/042

USPC ........................... 310/314, 317, 318
See application file for complete search history.

(56) References Cited

U.S. PATENT DOCUMENTS 6,204,591 B1 * 3/2001 Nariai ..................... 310/316.03
2004/0169545 A1   9/2004 Aiba et al.

FOREIGN PATENT DOCUMENTS

EP       1555747      7/2005
JP       63167684     7/1988
(Continued)

OTHER PUBLICATIONS

International Search Report in PCT Application PCT/IB2011/052502, EPO, Dec. 6, 2011.

(Continued)

*Primary Examiner* — Derek Rosenau
(74) *Attorney, Agent, or Firm* — Bourque and Associates, PA

(57) ABSTRACT

An apparatus for reducing energy consumption in monitoring means of a plurality of piezoelectric components comprises a plurality of piezoelectric components as well as monitoring means for monitoring the status of the piezoelectric components. The monitoring means have two states namely active and inactive. The piezoelectric components are connected in parallel to each other. A current detecting circuit comprises a switch and a resistor that is connected in parallel to the switch. A controller having two states that are active and inactive. The controller is configured to open the switch in response to the controller being in the inactive state and to close the switch in response to the controller being in the active state. The closing of the switch triggers a state change in the monitoring means from their inactive state to their active state.

8 Claims, 2 Drawing Sheets

(56) References Cited

FOREIGN PATENT DOCUMENTS

| | | |
|---|---|---|
| JP | 2002217462 | 8/2002 |
| WO | 2007088390 | 8/2007 |

OTHER PUBLICATIONS

International Preliminary Report on Patentability in PCT Application PCT/IB2011/052502, EPO, Jul. 12, 2012.

* cited by examiner

APPARATUS AND METHOD FOR REDUCING ENERGY CONSUMPTION IN MONITORING MEANS OF A PLURALITY OF PIEZOELECTRIC COMPONENTS

FIELD OF THE INVENTION

The invention relates to sensor technology, and in particular sensors in which piezoelectric components are employed.

TECHNICAL BACKGROUND

In machines, devices and systems in which a plurality of piezoelectric components are employed and in which each of the piezoelectric components must be monitored in respective monitoring means, power consumption is high even at times when none of the piezoelectric components is being used since the monitoring is apt to consume power.

SUMMARY OF THE INVENTION

It is the objective of the present invention to reduce power consumption in monitoring means of a plurality of piezoelectric components, at times when none of the piezoelectric components is active.

This objective can be achieved by use of an apparatus according to independent claim 1, and by use of the method according to independent claim 8.

The dependent claims describe advantageous embodiments of the apparatus.

The apparatus for reducing energy consumption in monitoring means of a plurality of piezoelectric components comprises a plurality of piezoelectric components, and monitoring means for monitoring the status of the piezoelectric components, said monitoring means having two states that are active and inactive.

In the apparatus, the piezoelectric components are connected in parallel to each other and a current detecting circuit that comprises: i) a switch and ii) a resistor that is connected in parallel to said switch, and iii) a controller having two states that are active and inactive, the controller configured to:
open the switch, in response to the controller being in the inactive state; and
close the switch, in response to the controller being in the active state, the closing of the switch triggering a state change in the monitoring means from their inactive state to their active state.

A method for reducing energy consumption in monitoring means of a plurality of piezoelectric components, the method characterized by the steps of:
using an apparatus according to the invention to detect activity of a plurality of piezoelectric components;
in response to detecting that none of said piezoelectric components is active, opening the switch in said apparatus, thereby triggering a state change in the monitoring means to the inactive state; and
in response to detecting that at least one of said piezoelectric components is active, closing the switch in said apparatus, thereby triggering a state change in the monitoring means to the active state.

ADVANTAGES OF THE INVENTION

With the apparatus and method, power consumption in monitoring means of a plurality of piezoelectric components can be reduced at times when none of the piezoelectric components is being used.

The inventors have noticed that, in all earlier machines, devices and systems known to them, where a plurality of piezoelectric components have been employed, either specific monitoring circuits for each piezoelectric component has been used, or each of the piezoelectric components has been connected to a multiplexer. In order to monitor the piezoelectric components, each of the specific monitoring circuits has to poll the respective piezoelectric component, or, if the multiplexer solution has been chosen, the multiplexer has to poll each of the piezoelectric components continuously. Both solutions consume a lot of power.

The present apparatus makes use of the finding that a single current detecting circuit can be used to monitor activity of a plurality of piezoelectric components and, if activity is detected, trigger a state change in the monitoring means. By using a single current detecting circuit, power can be saved since the power consumption is, at times when none of the piezoelectric components is active, no more proportional to the number of piezoelectric components that are to be monitored.

In particular, power can be saved if the single current detecting circuit,
i) in response to detecting that none of said piezoelectric components is active, opens the switch in the apparatus, thereby triggering a state change in the monitoring means to the inactive state; and
ii) in response to detecting that at least one of said piezoelectric components is active, closes the switch in the apparatus, thereby triggering a state change in the monitoring means to the active state.

This approach is useful for both the approach of having a multiplexer to monitor a plurality of piezoelectric components and the approach of having a dedicated monitoring circuit for each piezoelectric component.

If the monitoring means are or include a plurality of monitoring circuits each connected to a respective piezoelectric component, the apparatus enables energy saving in a configuration where there is a dedicated monitoring circuit for each piezoelectric component.

If the monitoring means are or include a multiplexer connected to an analog-to-digital converter, the multiplexer having inputs that are connected to respective piezoelectric component, the apparatus energy saving in a configuration where there is a multiplexer to monitor a plurality of piezoelectric components.

If the current detecting circuit comprises a voltage comparator that is configured to compare a reference voltage with that of any of the piezoelectric sensor and to change the state of the controller to active in the event of a high enough current, the current detecting circuit can be automated in a particularly simple manner.

If the current detecting circuit further comprises an analog-to-digital converter that is configured to periodically measure voltage over the resistor and to change the state of the controller to active in the event of a high enough voltage, the current detecting circuit can be implemented digitally and due to the fact that the measurements are carried out periodically, energy saving can be achieved with the apparatus.

Most advantageously the apparatus is a sensor apparatus, in particular a touch sensor. The sensor apparatus is then most advantageously part of a user interface of a machine, a device, or a system.

BRIEF DESCRIPTION OF THE DRAWINGS

In the following, the method and exemplary embodiments of the apparatus are discussed in more detail with reference of the examples shown in the attached drawings, of which.

Same reference numerals refer to similar technical features in all drawings.

DETAILED DESCRIPTION

If the electric signals of many piezoelectric components are monitored, then either one monitoring apparatus per piezoelectric component is required, or many piezoelectric elements are connected to one monitoring apparatus through a multiplexer. In the first instance the current consumption increases with the amount of piezoelectric elements because each monitor requires current to operate. In the second instance each piezoelectric component must continuously be polled by selecting it with the multiplexer. The continuous polling requires current to operate. In both cases a lot of electric power is required for the possibly long duration when none of the piezoelectric elements is producing a signal. Also in both cases the power consumption increases with the amount of piezoelectric component elements.

Accordingly, it is desirable to be able to suspend the operation of the monitoring circuits while there is no activity and to be able to start the operation of the monitoring circuits using a single trigger circuit for any number of piezoelectric elements.

The coinventors of the present invention have found out that it is possible to detect activity of a multitude of piezoelectric elements using only a single activity detecting circuit.

While the following description of the apparatus and method uses three piezoelectric components in the exemplary embodiments, it should be understood that the number of piezoelectric components can be varied, and is not limited to three.

Figure 1:
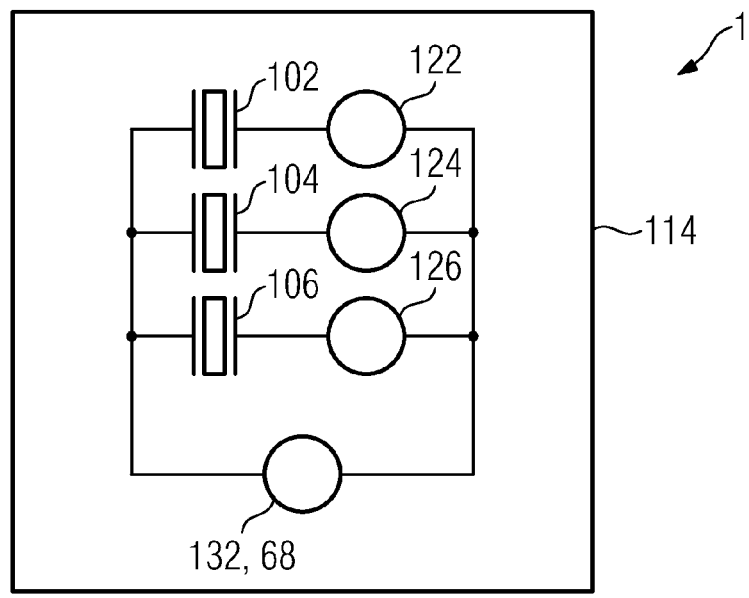
FIG. 1 is a schematic diagram of the components of the present invention.

Referring now to the invention in more detail, in FIG. 1 there is shown a circuit 114 having three piezoelectric components each monitored by monitoring circuits, namely a first piezoelectric component 102 connected to a first monitoring circuit 122, a second piezoelectric component 104 connected to a second monitoring circuit 124 and a third piezoelectric component 106 connected to a third monitoring circuit 126. The piezoelectric components 102, 104, 106 are each connected to a current detection circuit 132. The returns of the monitoring circuits 122, 124 and 126 are each connected to a current detection circuit 132.

The monitoring circuits 122, 124 and 126 have two states: active and inactive. In inactive state, the monitoring circuits 122, 124 and 126 are not measuring the signal from the corresponding piezoelectric components 102, 104 or 106. In active state, they measure the signal from the corresponding piezoelectric component 102, 104 or 106 and consequently use more electric power. Upon any activity of the piezoelectric components 102, 104, 106 while the monitoring circuits 122, 124 and 126 are in inactive state, a current will flow through the current detection circuit 132, which will cause it to trigger a state change of the monitoring circuits 122, 124 and 126 from their passive state into their active state. The monitoring circuits 122, 124, 126 may transition between active and inactive states due to external events that are independent on the state of the piezoelectric sensors 102, 104, or 106.

Figure 2:
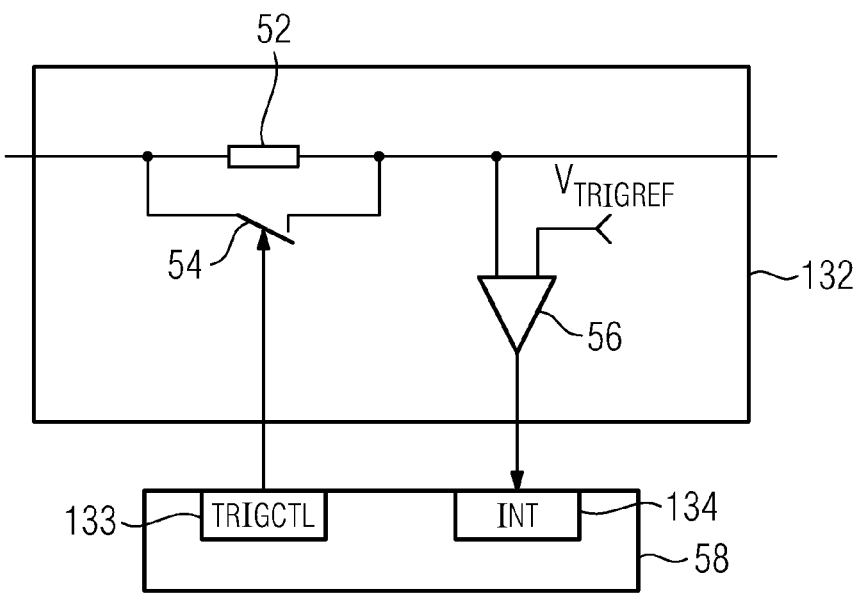
FIG. 2 is a schematic diagram of the current detection circuit.

FIG. 2 shows one embodiment of a current detection circuit 132 comprising a resistor 52, a digitally controlled switch 54 connected to a first output 133 of controller 58 and a voltage comparator 56 connected to a first input 134 of a controller 58. When the controller 58 is its inactive state it is monitoring the output of the voltage comparator 56 keeping the switch 54 in its open position. In the event of a high enough current i.e. triggering voltage level, the comparator 56 will change the state of its output 133. This state change is detected by the controller 58, which enters its active state and changes the state of the switch 54 into its closed position. When the controller 58 enters its inactive state, it enables the current detection circuit 132 by changing the state of the switch 54 into its open position.

The apparatus 1, 4 may be in active state regardless of the state of the piezoelectric components 102, 104, 106, 72, 74, 76, such as when it is communicating with an external circuit.

The controller 58 may enter the inactive state when all the following criteria are met:
  i. there is no detectable activity on any one of the piezoelectric components 102, 104, 106, 72, 74, 76; and
  ii. there are no ongoing tasks other than measuring the piezoelectric components 102, 104, 106, 72, 74, 76, such as communicating with a circuit external to the controller 58, or running a software or hardware task internal to the controller.

The controller 58 may exit the inactive state if any of the following criteria is met:
  iii) The voltage comparator 56 triggers the active state of controller 58; or
  iv) Circuits external to the controller 58 need to communicate and thereby trigger the active state of controller 58.

Figure 3:
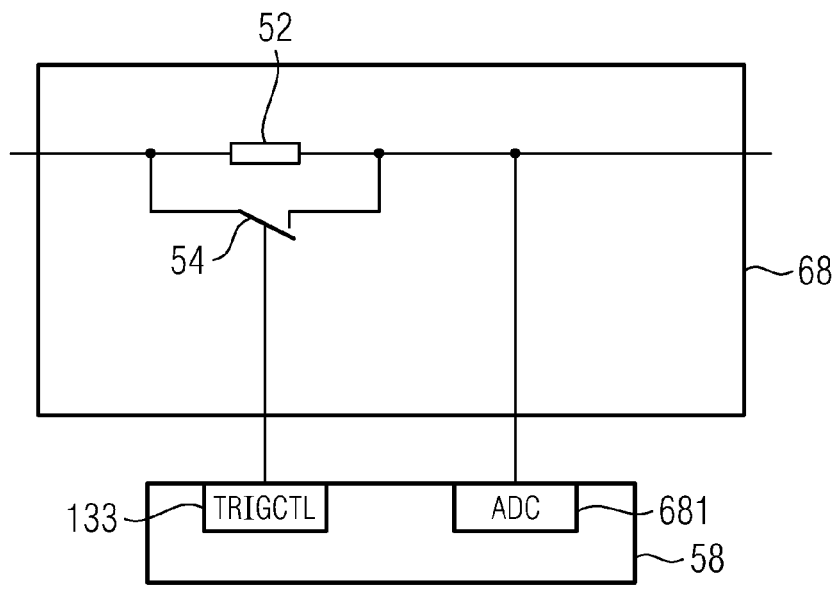
FIG. 3 is a schematic diagram of another embodiment of the current detection circuit.

FIG. 3 shows another embodiment of a current detection circuit 68 where the comparator 56 is not present. Instead the voltage over the resistor 52 is periodically measured using an analog-to-digital converter 681 in the controller 58.

Figure 4:
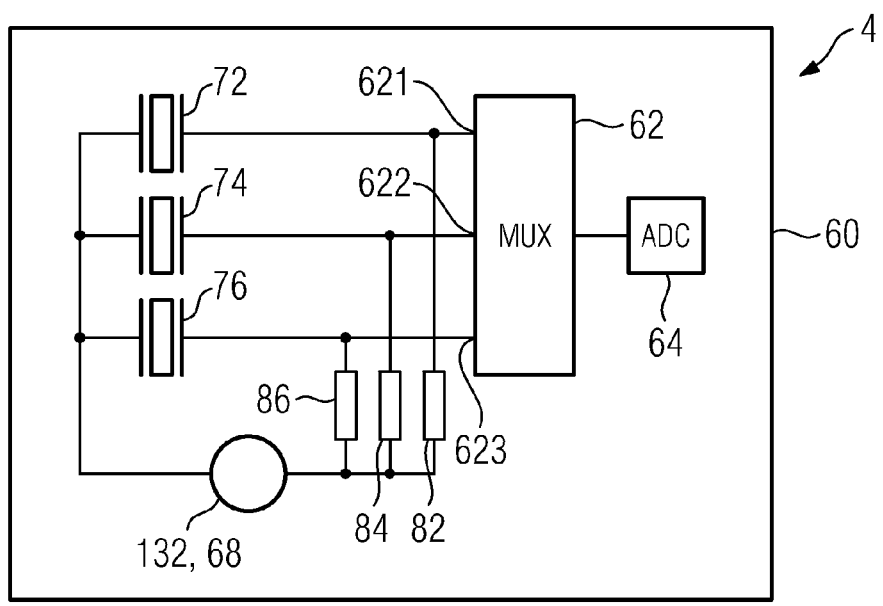
FIG. 4 is a schematic diagram of one embodiment of a three channel measurement circuit utilizing a current detection circuit for changing from inactive to active state.

FIG. 4 shows one embodiment of a measurement circuit 60 comprising three piezoelectric components 72, 74, 76 connected to a multiplexer 62, namely a first piezoelectric component 72 connected to both a resistor 82 and a first input 621 of multiplexer 62, a second piezoelectric component 74 connected to both a resistor 84 and a second input 622 of multiplexer 62 and a third piezoelectric component 76 connected to both a resistor 86 and a third input 623 of multiplexer 62. The multiplexer 62 is able to connect one of its inputs 621, 622, 623 to an analog-to-digital converter 64. Each of the piezoelectric components 72, 74, 76 is connected to a current detection circuit 68. Each of the resistors 82, 84, 86 is connected to a current detection circuit 68.

The present invention enables a controller 58 and surrounding circuitry such as multiplexer 62 and analog-to-digital converter 64 to remain completely inactive, consuming a minimal amount of electric power, while there is no relevant signal to measure. Upon detecting activity the controller 58 and peripheral circuitry are activated into a high power state.

The present invention enables very low power consumption that is independent on the amount of piezoelectric component elements being monitored.

The invention claimed is:

1. An apparatus (1, 4) for reducing energy consumption in monitoring means of a plurality of piezoelectric components, the apparatus (1, 4) comprising:
   a plurality of piezoelectric components (102, 104, 106; 72, 74, 76) that are piezoelectric sensors;

monitoring means (122, 124, 126; 62, 64) for monitoring the status of the piezoelectric components (102, 104, 106; 72, 74, 76), said monitoring means (122, 124, 126; 62, 64) having two states that are active and inactive; and wherein:

the piezoelectric components (102, 104, 106; 72, 74, 76) are connected in parallel to each other and to a current detecting circuit (132; 68) that comprises: i) a switch (54) and ii) a resistor (52) that is connected in parallel to said switch (54), and iii) a controller (58) having two states that are active and inactive, the controller (58) configured to:

open the switch (54), in response to the controller (58) being in the inactive state when no signal from any of the piezoelectric components (102, 104, 106; 72, 74, 76) exceeding a threshold ($V_{TRIGREF}$) is present, thus disconnecting a bypass of an additional resistor (52) between the plurality of piezoelectric components (102, 104, 106; 72, 74, 76) and the monitoring means (122, 124, 126; 62, 64); and close the switch (54), in response to the controller (58) being in the active state, the closing of the switch (54) triggering a state change in the monitoring means (122, 124, 126; 62) from their inactive state to their active state when a signal from any of the piezoelectric components (102, 104, 106; 72, 74, 76) exceeding a threshold ($V_{TRIGREF}$) is present, thus bypassing the additional resistor (52) between the plurality of piezoelectric components (102, 104, 106; 72, 74, 76) and the monitoring means (122, 124, 126; 62, 64).

2. An apparatus (1) according to claim 1, wherein: the monitoring means (122, 124, 126) are or include a plurality of monitoring circuits (122, 124, 126) each connected to a respective piezoelectric component (102, 104, 106).

3. An apparatus (4) according to claim 1, wherein: the monitoring means (62, 64) are or include a multiplexer (62) connected to an analog-to-digital converter (64), the multiplexer (62) having inputs (621, 622, 623) that are connected to respective piezoelectric component (72, 74, 76).

4. An apparatus (1, 4) according to claim 1, wherein: the current detecting circuit (132) comprises a voltage comparator (56) that is configured to compare a reference voltage (VTRIGREF) with that of any of the piezoelectric sensors (102, 104, 106) and to change the state of the controller (58) to active in the event of a high enough current.

5. An apparatus (1, 4) according to claim 1, wherein: the current detecting circuit (132) further comprises an analog-to-digital converter that is configured to periodically measure voltage over the resistor (52) and to change the state of the controller (58) to active in the event of a high enough voltage.

6. An apparatus (1, 4) according to claim 1, wherein the device (1, 4) is a sensor apparatus.

7. An apparatus (1, 4) according to claim 6, wherein said sensor apparatus is part of a user interface of a machine, a device, or a system.

8. A method for reducing energy consumption in monitoring means of a plurality of piezoelectric components (102, 104, 106; 72, 74, 76), the method characterized by the steps of:

using an apparatus (1, 4) according to claim 1 to detect activity of a plurality of piezoelectric components (102, 104, 106; 72, 74, 76) that are piezoelectric sensors; and in response to detecting that none of said piezoelectric components (102, 104, 106; 72, 74, 76) is active, opening the switch in said apparatus (1, 4), thereby triggering a state change in the monitoring means (122, 124, 126; 62, 64) to the inactive state, thus disconnecting a bypass of an additional resistor (52) between the plurality of piezoelectric components (102, 104, 106; 72, 74, 76) and the monitoring means (122, 124, 126; 62, 64);

in response to detecting that at least one of said piezoelectric components (102, 104, 106; 72, 74, 76) is active, closing the switch in said apparatus (1, 4), thereby triggering a state change in the monitoring means (122, 124, 126; 62, 64) to the active state when a signal from any of the piezoelectric components (102, 104, 106; 72, 74, 76) exceeding a threshold ($V_{TRIGREF}$) is present, thus bypassing the additional resistor (52) between the plurality of piezoelectric components (102, 104, 106; 72, 74, 76) and the monitoring means (122, 124, 126; 62, 64).

* * * * *